(12) United States Patent
Sonoda et al.

(10) Patent No.: US 11,522,156 B2
(45) Date of Patent: Dec. 6, 2022

(54) DISPLAY DEVICE WITH LIGHT-TRANSMISSIVE CONDUCTIVE FILM BETWEEN SEALING FILMS

(71) Applicant: SHARP KABUSHIKI KAISHA, Sakai (JP)

(72) Inventors: Tohru Sonoda, Sakai (JP); Takashi Ochi, Sakai (JP); Hisao Ochi, Sakai (JP); Akihiro Matsui, Sakai (JP); Tohru Senoo, Sakai (JP); Takeshi Hirase, Sakai (JP); Jumpei Takahashi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 208 days.

(21) Appl. No.: 17/042,853

(22) PCT Filed: Mar. 29, 2018

(86) PCT No.: PCT/JP2018/013209
§ 371 (c)(1),
(2) Date: Sep. 28, 2020

(87) PCT Pub. No.: WO2019/186884
PCT Pub. Date: Oct. 3, 2019

(65) Prior Publication Data
US 2021/0020863 A1    Jan. 21, 2021

(51) Int. Cl.
*H01L 51/52* (2006.01)
*H01L 27/32* (2006.01)

(52) U.S. Cl.
CPC ...... *H01L 51/5243* (2013.01); *H01L 27/3246* (2013.01); *H01L 27/3276* (2013.01); *H01L 51/5253* (2013.01)

(58) Field of Classification Search
CPC ............. H01L 51/5243; H01L 51/5253; H01L 27/3246; H01L 27/3276
See application file for complete search history.

(56) References Cited

U.S. PATENT DOCUMENTS 10,319,938 B2 * 6/2019 Choi ................... H01L 51/5056
2010/0253215 A1 * 10/2010 Fukagawa ........... H01L 51/5234
313/504

(Continued)

FOREIGN PATENT DOCUMENTS

JP    2016-054144 A    4/2016
WO   2018/061237 A1   4/2018

*Primary Examiner* — Lex H Malsawma
(74) *Attorney, Agent, or Firm* — ScienBiziP, P.C.

(57) ABSTRACT

A display device includes: a base substrate; a TFT layer; a plurality of light-emitting elements; a sealing portion; a display region; and a frame region, wherein the sealing portion includes a first sealing film provided on the plurality of light-emitting elements, a second sealing film provided above the first sealing film, a third sealing film provided above the second sealing film, and a light-transmissive conductive film provided between two sealing films of the first sealing film, the second sealing film, and the third sealing film, an edge of the first sealing film and an edge of the third sealing film are positioned outward of an edge of the second sealing film in the frame region, and the light-transmissive conductive film is electrically connected to a first electrodes or a second electrode.

19 Claims, 13 Drawing Sheets

(56) References Cited

U.S. PATENT DOCUMENTS

| | | | |
|---|---|---|---|
| 2016/0035803 A1* | 2/2016 | Kim | H01L 27/3246 |
| | | | 438/34 |
| 2016/0064690 A1 | 3/2016 | Kook et al. | |
| 2016/0233458 A1* | 8/2016 | Shen | H01L 27/3211 |
| 2018/0159074 A1* | 6/2018 | Kim | H01L 51/5246 |
| 2018/0159078 A1 | 6/2018 | Kook et al. | |

* cited by examiner

DISPLAY DEVICE WITH LIGHT-TRANSMISSIVE CONDUCTIVE FILM BETWEEN SEALING FILMS

TECHNICAL FIELD

The disclosure relates to a display device.

BACKGROUND ART

Self-luminous organic electroluminescent (EL) display devices, which use organic EL elements (light-emitting elements), have attracted attention as display devices replacing liquid crystal display devices. Here, in such an organic EL display device, for example, a plurality of organic EL elements are arranged in a matrix shape and a display region configured to display an image is defined by the plurality of organic EL elements as described in PTL 1 below. Each organic EL element of the organic EL display device includes an anode electrode, a cathode electrode, and a function layer interposed between the anode electrode and the cathode electrode having an organic EL layer (light-emitting layer) that is formed of an organic material. In addition, the organic EL display device has a sealing structure in which the organic EL elements are covered by a sealing portion to curb degradation of the organic EL elements caused by penetration of moisture, oxygen, and the like.

CITATION LIST

Patent Literature

PTL 1: Japanese Unexamined Patent Application Publication No. 2016-54144

SUMMARY

Technical Problem

However, for known organic EL display devices such as those described above, there are cases in which a reduction in brightness of the display region caused by resistance of internal wiring lines, electrodes, and the like provided inside the organic EL display device cannot be curbed.

To be specific, in a known organic EL display device, high power supply voltage lines (ELVDD) are provided for each of a plurality of organic EL elements, and the plurality of high power supply voltage lines are each connected to a plurality of anode electrodes (first electrodes). In addition, in the known organic EL display device, a low power supply voltage electrode (ELVSS) is provided as a cathode electrode (second electrode) shared by the plurality of organic EL elements. Thus, in the known organic EL display device, it is difficult to reduce the resistance of the high power supply voltage lines or the resistance of the low power supply voltage electrode, or reduce variation in the resistance. As a result, in the known organic EL display device, there is a problem that it is difficult to curb a reduction in brightness of the display region.

In light of the above problems, an object of the disclosure is to provide a display device capable of curbing a reduction in brightness caused by resistance of internal wiring lines, electrodes, or the like.

Solution to Problem

To achieve the objective, a display device according to the disclosure includes a base substrate, a TFT layer provided on the base substrate, a plurality of light-emitting elements provided on the TFT layer, a sealing portion provided covering the plurality of light-emitting elements, a display region defined by the plurality of light-emitting elements, and a frame region surrounding the display region, in which the plurality of light-emitting elements includes a plurality of first electrodes, a second electrode shared by the plurality of light-emitting elements, and a function layer interposed between the plurality of first electrodes and the second electrode, the sealing portion includes a first sealing film provided on the plurality of light-emitting elements, a second sealing film provided above the first sealing film, a third sealing film provided above the second sealing film, and a light-transmissive conductive film provided between two sealing films of the first sealing film, the second sealing film, and the third sealing film, an edge of the first sealing film and an edge of the third sealing film are positioned outward of an edge of the second sealing film in the frame region, and the light-transmissive conductive film is electrically connected to the plurality of first electrodes or the second electrode.

Advantageous Effects of Disclosure

Because the light-transmissive conductive film is electrically connected to the first electrode or the second electrode, it is possible to curb a reduction in brightness of the display region caused by resistance of the internal wiring lines, electrodes, or the like.

DESCRIPTION OF EMBODIMENTS

Embodiments of the disclosure will be described below in detail with reference to the drawings. Note that the disclosure is not limited to the embodiments which will be described below. In addition, the following description will be made by giving an example in which the disclosure is applied to an organic EL display device. In addition, in each of the drawings, the dimensions of constituent elements are not precisely illustrated as the actual dimensions of the constituent elements and the dimensional proportions of each of the constituent elements.

First Embodiment

Figure 1:
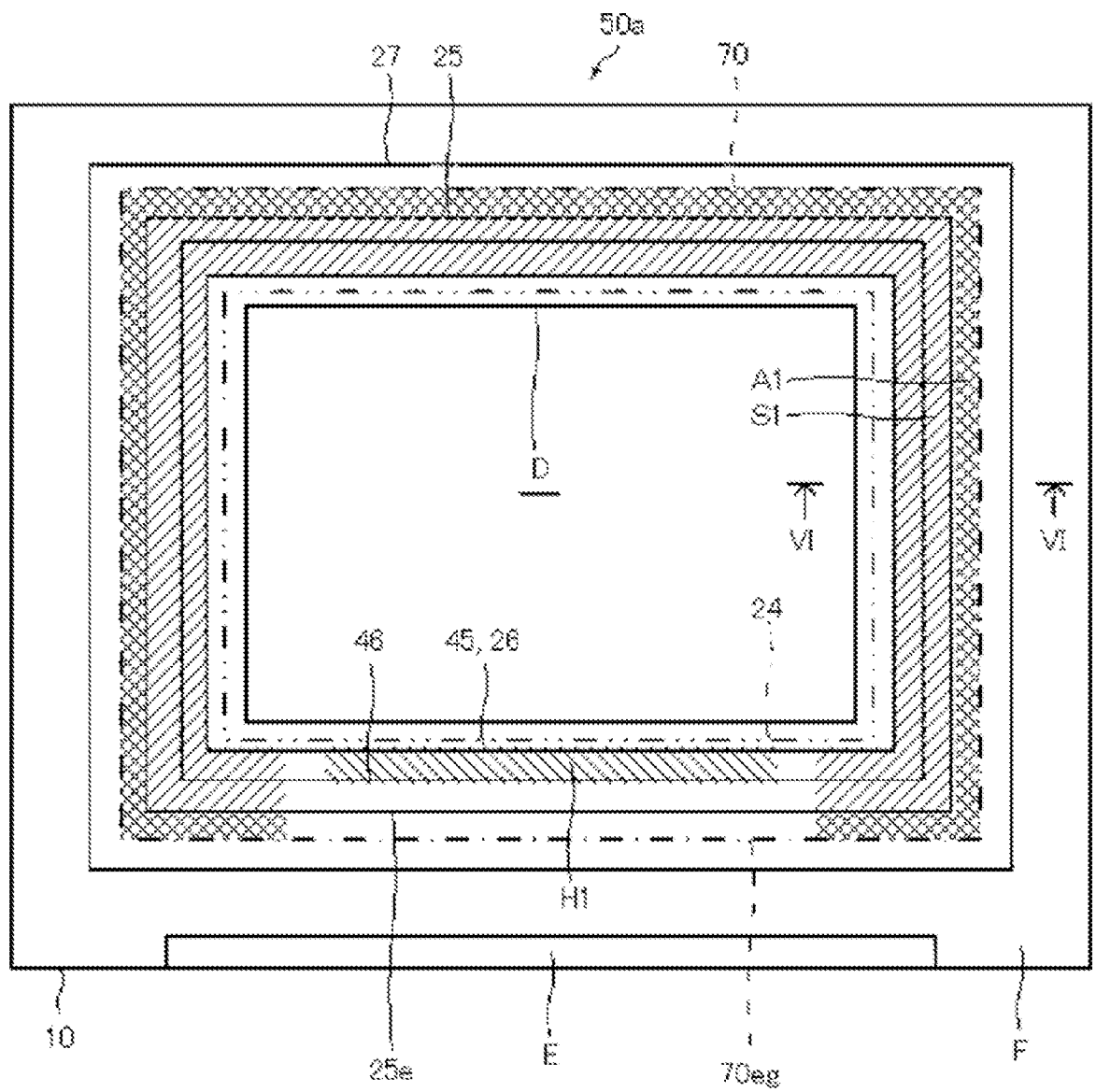
FIG. 1 is a plan view illustrating a configuration of main parts of an organic EL display device according to a first embodiment of the disclosure.
Figure 2:
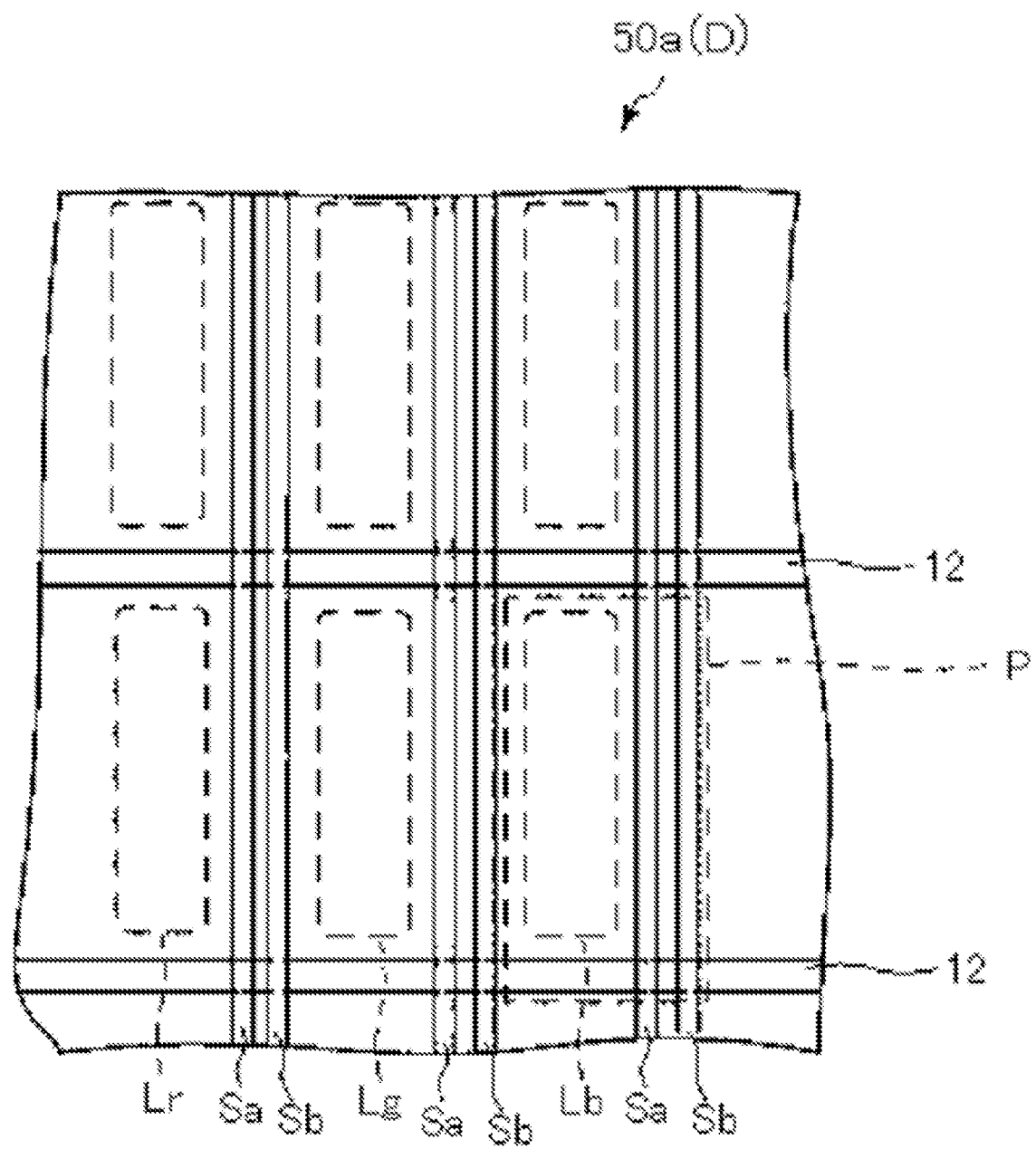
FIG. 2 is a diagram for describing a schematic internal configuration of a display region of the organic EL display device illustrated in FIG. 1.
Figure 3:
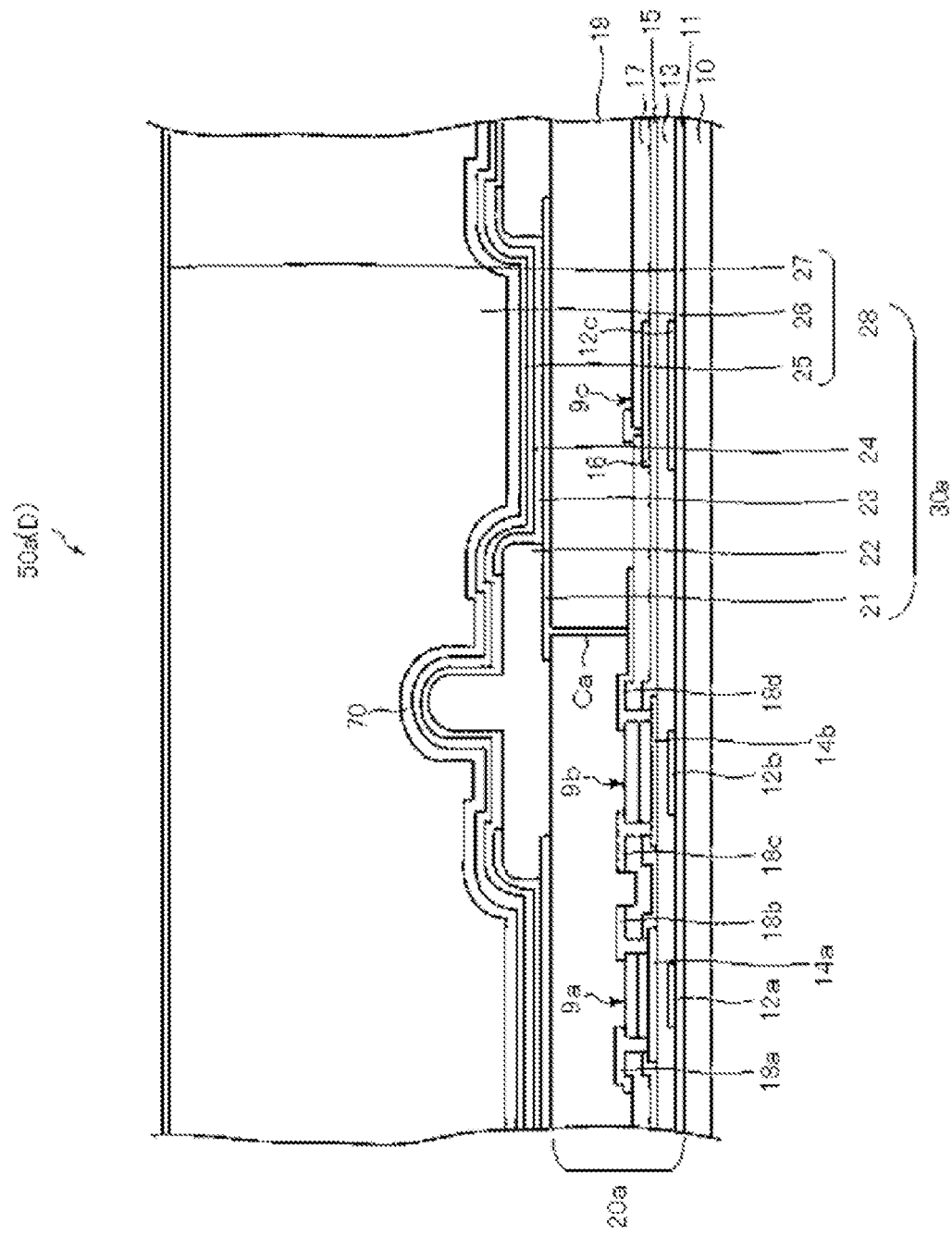
FIG. 3 is a cross-sectional view illustrating a configuration of main parts of the display region of the organic EL display device illustrated in FIG. 1.
Figure 4:
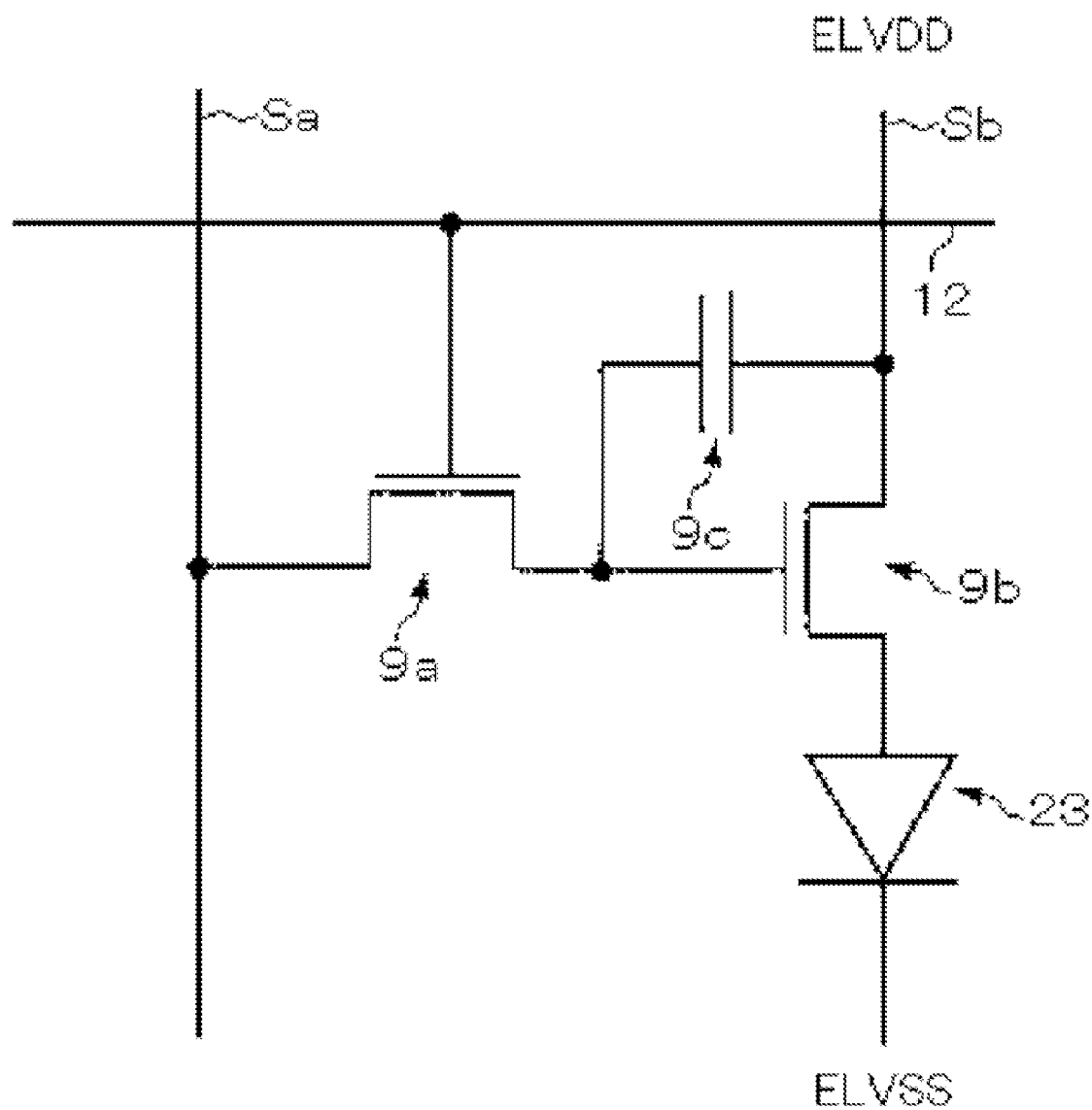
FIG. 4 is an equivalent circuit diagram illustrating a TFT layer illustrated in FIG. 3.
Figure 5:
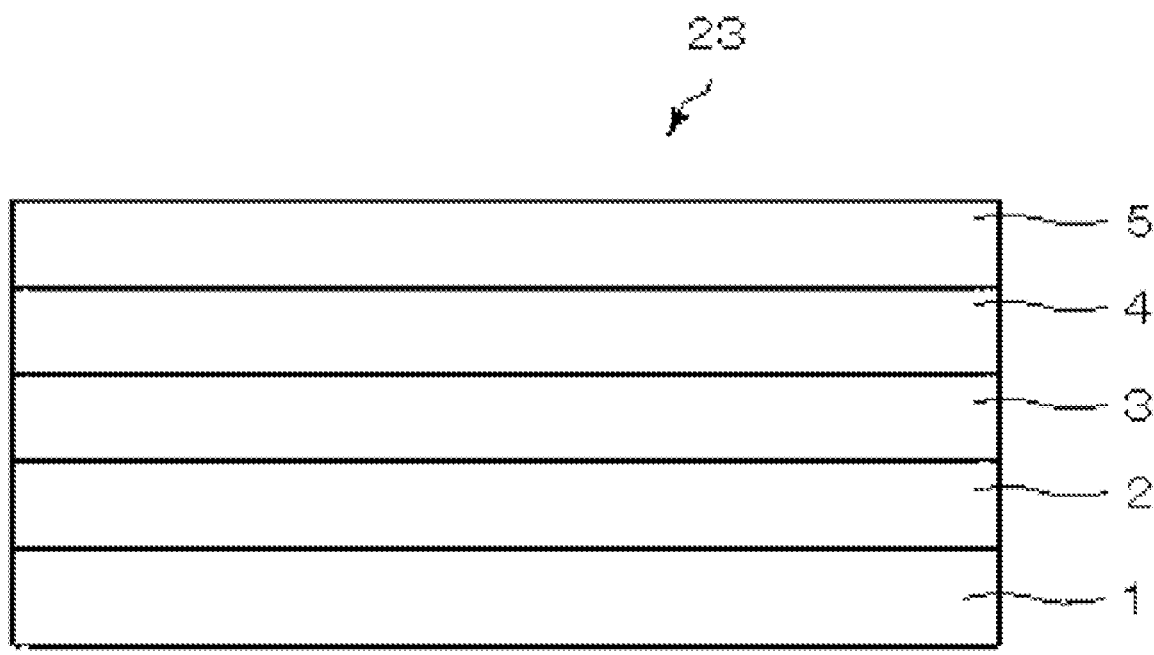
FIG. 5 is a cross-sectional view illustrating an organic EL layer illustrated in FIG. 3.
Figure 6:
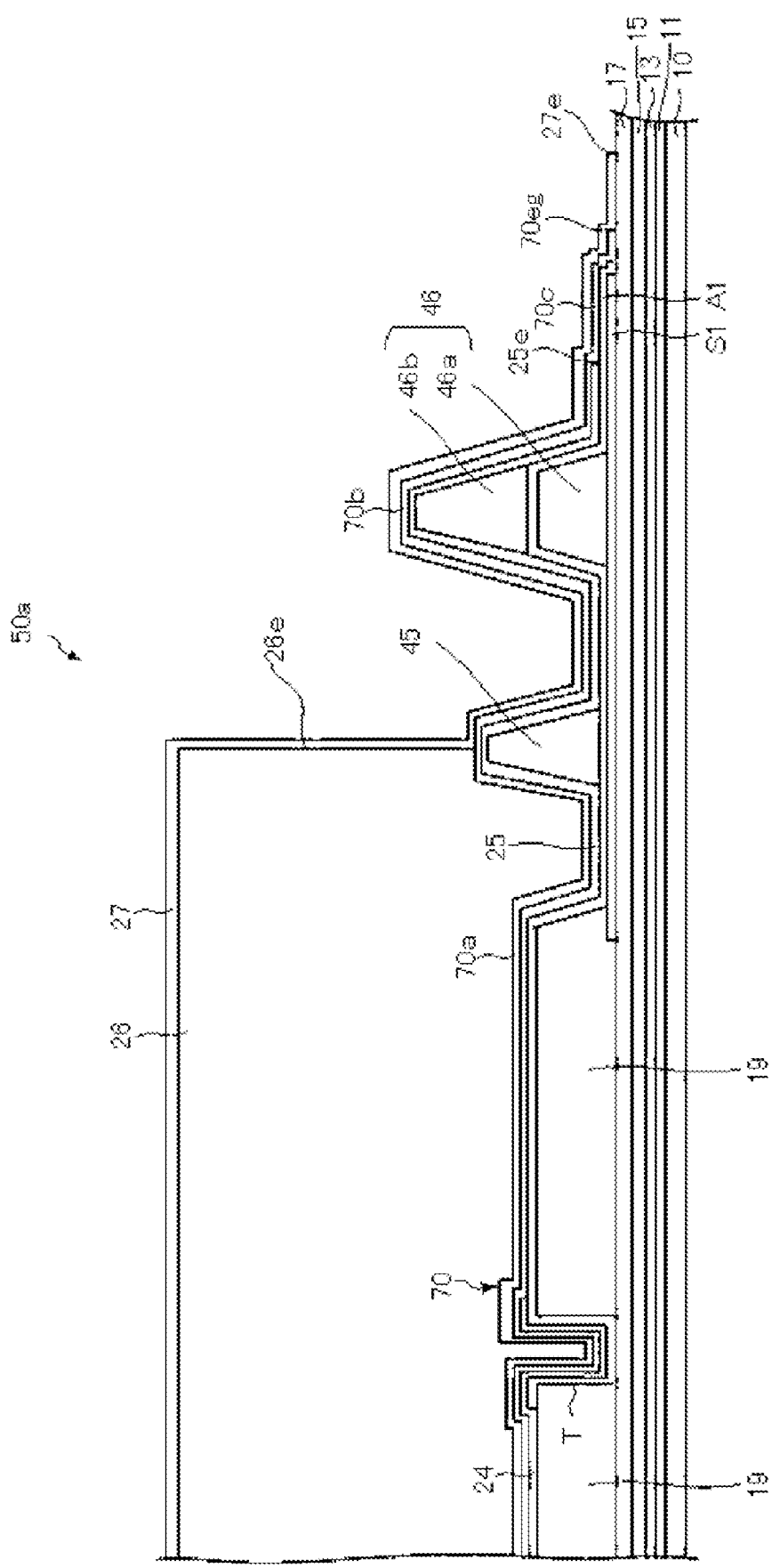
FIG. 6 is a cross-sectional view illustrating a configuration of main parts of the organic EL display device illustrated in FIG. 1 and a cross-sectional view along the line VI-VI of FIG. 1.

FIG. 1 is a plan view illustrating a configuration of main parts of an organic EL display device according to a first embodiment of the disclosure. FIG. 2 is a diagram for describing a schematic internal configuration of a display region of the organic EL display device illustrated in FIG. 1. FIG. 3 is a cross-sectional view illustrating a configuration of main parts of the display region of the organic EL display device illustrated in FIG. 1. FIG. 4 is an equivalent circuit diagram illustrating a TFT layer illustrated in FIG. 3. FIG. 5 is a cross-sectional view illustrating an organic EL layer illustrated in FIG. 3. FIG. 6 is a cross-sectional view illustrating a configuration of main parts of the organic EL display device illustrated in FIG. 1 and a cross-sectional view along the line VI-VI of FIG. 1.

As illustrated in FIG. 1, an organic EL display device 50a includes a display region D configured to display an image provided in a rectangular shape and a frame region F provided around the display region D. In addition, in the frame region F, a terminal portion E is provided at an end portion of the frame region F, and wiring lines (not illustrated) provided in a plurality of light-emitting elements, which will be described below, defining the display region are connected to the terminal portion E. In addition, a flexible printed circuit board, which is not illustrated, is connected to the terminal portion E, for example, and a signal, a power supply voltage, and the like are supplied to the pixels via the flexible printed circuit board.

In addition, a plurality of subpixels P are arranged in a matrix shape in the display region D as illustrated in FIG. 2. To be specific, in the display region D, a subpixel P including a red light-emitting region Lr configured to display red, a subpixel P including a green light-emitting region Lg configured to display green, and a subpixel P including a blue light-emitting region Lb configured to display blue are provided adjacent to one another. Here, one pixel is constituted by three adjacent subpixels P including a red light-emitting region Lr, a green light-emitting region Lg, and a blue light-emitting region Lb in the display region D.

The organic EL display device 50a includes a base substrate 10, a thin film transistor (TFT) layer 20a provided on the base substrate 10, and organic EL elements 30a provided on the TFT layer 20a serving as tight-emitting elements as illustrated in FIG. 3.

The base substrate 10 is a plastic substrate made of a polyimide resin, for example.

The TFT layer 20a includes a base coat film 11 provided on the base substrate 10, a plurality of first thin film transistors 9a, a plurality of second thin film transistors 9b and a plurality of capacitors 9c provided on the base coat film 11, and a flattening film 19 provided on each first thin film transistor 9a, each second thin film transistor 9b, and each capacitor 9c as illustrated in FIG. 3. Here, as illustrated in FIG. 2 and FIG. 4, a plurality of gate lines 12 are provided to extend parallel to each other in the horizontal direction in the drawings in the TFT layer 20a. In addition, as illustrated in FIG. 2 and FIG. 4, in the TFT layer 20a, a plurality of source lines Sa are provided to extend parallel to each other in the vertical direction in the drawings. In addition, as illustrated in FIG. 2 and FIG. 4, in the TFT layer 20a, a plurality of power supply lines Sb are provided to extend parallel to each other in the vertical direction in the drawings while being adjacent to each of the source lines Sa. In addition, as illustrated in FIG. 4, each of the power source lines Sb is an internal wiring line constituting a high power supply voltage line (ELVDD) and is conductive between an anode electrode of the organic EL layer, which will be described below, and a high power supply voltage source, which is not illustrated. In addition, in the TFT layer 20a, each subpixel P includes the first thin film transistor 9a, the second thin film transistor 9b, and the capacitor 9c as illustrated in FIG. 4.

The base coat film 11 is made of a single-layer film or a layered film of an inorganic insulating film of, for example, silicon nitride, silicon oxide, silicon oxynitride, or the like.

The first thin film transistor 9a is connected to the corresponding gate line 12 and source line Sa in each subpixel P as illustrated in 4. In addition, the first thin film transistor 9a includes a gate electrode 12a, a gate insulating film 13, a semiconductor layer 14a, a first interlayer insulating film 15, a second interlayer insulating film 17, and a source electrode 18a and a drain electrode 18b provided in that order on the base coat film 11 as illustrated in FIG. 3.

Here, the gate electrode 12a is provided in an island shape on the base coat film 11 as illustrated in FIG. 3. In addition, the gate insulating film 13 is provided to cover the gate electrode 12a as illustrated in FIG. 3. In addition, the semiconductor layer 14a is provided to overlap the gate electrode 12a on the gate insulating film 13 as illustrated in FIG. 3, and includes a channel region overlapping the gate electrode 12a, and a source region and a drain region disposed with the channel region interposed between them.

Furthermore, the first interlayer insulating film 15 and the second interlayer insulating film 17 are provided in that order to cover the channel region of the semiconductor layer 14a as illustrated in FIG. 3. In addition, the source electrode 18a and the drain electrode 18b are provided to be separated from each other on the second interlayer insulating film 17 as illustrated in FIG. 3. In addition, the source electrode 18a and the drain electrode 18b are connected to the source region and the drain region of the semiconductor layer 14a, respectively, via contact holes formed in the layered film of the first interlayer insulating film 15 and the second interlayer insulating film 17 as illustrated in FIG. 3.

In addition, the gate insulating film 13, the first interlayer insulating film 15, and the second interlayer insulating film 17 are made of a single-layer film or a layered film of an inorganic insulating film of, for example, silicon nitride, silicon oxide, silicon oxynitride, or the like.

The second thin film transistor 9b is connected to the corresponding first thin film transistor 9a and power source line Sb in each subpixel P as illustrated in FIG. 4. In addition, the first thin film transistor 9b includes a gate electrode 12b, the gate insulating film 13, a semiconductor layer 14b, the first interlayer insulating film 15, the second interlayer insulating film 17, and a source electrode 18c and a drain electrode 18d provided in that order on the base coat film 11 as illustrated in FIG. 3.

Here, the gate electrode 12b is provided in an island shape on the base coat film 11 as illustrated in FIG. 3. In addition, the gate insulating film 13 is provided to cover the gate electrode 12b as illustrated in FIG. 3. In addition, the semiconductor layer 14b is provided to overlap the gate electrode 12b on the gate insulating film 13 as illustrated in FIG. 3, and includes a channel region overlapping the gate electrode 12b, and a source region and a drain region disposed with the channel region interposed between them.

Furthermore, the first interlayer insulating film 15 and the second interlayer insulating film 17 are provided in that order to cover the channel region of the semiconductor layer 14b as illustrated in FIG. 3. In addition, the source electrode 18c and the drain electrode 18d are provided to be separated from each other on the second interlayer insulating film 17 as illustrated in FIG. 3. In addition, the source electrode 18c and the drain electrode 18d are connected to the source region and the drain region of the semiconductor layer 14b, respectively, via contact holes formed in the layered film of the first interlayer insulating film 15 and the second interlayer insulating film 17 as illustrated in FIG. 3.

Note that, although the first thin film transistor 9a and the second thin film transistor 9b of a bottom gate type are exemplified in the present embodiment, the first thin film transistor 9a and the second thin film transistor 9b may be TFTs of a top gate type.

The capacitor 9c is connected to the corresponding first thin film transistor 9a and power source line Sb in each subpixel P as illustrated in FIG. 4. Here, the capacitor 9c includes a lower conductive layer 12c formed of the same material in the same layer as the gate electrode 12a, the gate insulating film 13 and the first interlayer insulating film 15 provided in that order to cover the lower conductive layer 12c, and an upper conductive layer 16 provided on the first interlayer insulating film 15 to overlap the lower conductive layer 12c as illustrated in FIG. 3. Note that the upper conductive layer 16 is also referred to as a capacitance wiring line.

The flattening film 19 is formed of, for example, a colorless and transparent organic resin material, such as an acrylic resin, a polyimide resin, or an epoxy resin.

The organic EL element 30a includes a plurality of first electrodes 21, an edge cover 22, a plurality of organic EL layers 23, a second electrode 24, and a sealing portion 28 that are provided in that order on the flattening film 19 as illustrated in FIG. 3.

The plurality of first electrodes 21 are provided in a matrix shape on the flattening film 19 to correspond to a plurality of subpixels P as illustrated in FIG. 3. In addition, each first electrode 21 is an anode electrode of the organic EL element 30a and is connected to the drain electrode 18d of each second thin film transistor 9b via a contact hole Ca formed in the flattening film 19 as illustrated in FIG. 3. In addition, the first electrode 21 is electrically connected to the power source line Sb via the second thin film transistor 9b serving as a drive transistor of the organic EL element 30a (see FIG. 4). In addition, the first electrodes 21 have a function of injecting holes (positive holes) into the organic EL layer 23.

In addition, the first electrodes 21 are preferably formed of a material with a high work function to improve the efficiency of hole injection into the organic EL layer 23.

To be specific, examples of a material constituting the first electrodes 21 include a metallic material, for example, silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn), or the like. In addition, a material constituting the first electrodes 21 may be an alloy of astatine (At)-astatine oxide ($AtO_2$), for example. Furthermore, a material constituting the first electrodes 21 may be electrically conductive oxide, for example, tin oxide (SnO), zinc oxide (ZnO), indium tin oxide (ITO), or indium zinc oxide (IZO). In addition, the first electrodes 21 may be formed by layering a plurality of layers formed of any of the materials described above. Note that examples of compound materials with a high work function include, for example, indium tin oxide (ITO), indium zinc oxide (ILO), and the like.

The edge cover 22 is provided in a lattice shape to cover a peripheral portion of each first electrode 21 as illustrated in FIG. 3. Here, examples of a material constituting the edge cover 22 include organic films of, for example, a polyimide resin, an acrylic resin, a polysiloxane resin, a novolak resin, and the like.

A plurality of organic EL layers 23 are each disposed on the first electrodes 21, and are provided in a matrix shape to correspond to a plurality of subpixels as illustrated in FIG. 3. In addition, each organic EL layer 23 includes a hole injection layer 1, a hole transport layer 2, a light-emitting layer 3, an electron transport layer 4, and an electron injection layer 5, which are provided in that order on a first electrode 21 as illustrated in FIG. 5.

The hole injection layer 1 is also referred to as an anode electrode buffer layer, and functions to reduce an energy level difference between the first electrodes 21 and the organic EL layers 23 to thereby improve the efficiency of hole injection into the organic EL layers 23 from the first electrodes 21.

The hole transport layer 2 functions to improve the efficiency of hole transport from the first electrodes 21 to the organic EL layers 23.

The light-emitting layer 3 is a region in which holes and electrons are injected from the first electrodes 21 and the second electrode 24, respectively, and the holes and the electrons recombine when a voltage is applied by the first electrodes 21 and the second electrode 24.

The electron transport layer 4 functions to facilitate migration of electrons to the light-emitting layer 3 efficiently.

The electron injection layer 5 functions to reduce an energy level difference between the second electrode 24 and the organic EL layers 23 to thereby improve the efficiency of electron injection into the organic EL layers 23 from the second electrode 24, and can lower a drive voltage of the organic EL element 30 due to this function. Note that the electron injection layer 5 is also referred to as a cathode electrode buffer layer.

Furthermore, the hole injection layer 1, the hole transport layer 2, the light-emitting layer 3, the electron transport layer 4, and the electron injection layer 5 constitute a function layer in the claims. Note that, in addition to this description, the function layer may be, for example, a three-layer layered structure including a hole injection layercum-hole transport layer, a light-emitting layer, and an electron transport layer-cum-electron injection layer.

The second electrode 24 is a cathode electrode of the organic EL element 30a and is provided to cover each organic EL layer 23 and edge cover 22 as illustrated in FIG. 3. In addition, the second electrode 24 is provided to be shared by a plurality of organic EL elements 30a, and constitutes a low power supply voltage electrode (ELVSS). In addition, the second electrode 24 is connected to a low power supply voltage source (not illustrated) via the terminal portion E. In addition, the second electrode 24 functions to inject electrons into the organic EL layer 23. In addition, the second electrode 24 is preferably formed of a material with a low work function to improve the efficiency of electron injection into the organic EL layer 23.

To be specific, examples of a material constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (Lif), or the like. In addition, the second electrode 24 may be formed of an alloys of, for example, magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al), or the like.

In addition, the second electrode 24 may be formed of electrically conductive oxide, for example, tin oxide (SnO), zinc oxide (ZnO), indium tin oxide (ITO), indium zinc oxide (MO), or the like. In addition, the second electrode 24 may be formed by layering a plurality of layers formed of any of the materials described above.

Note that, examples of materials with a low work function include, for example, magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), lithium fluoride (LiF)-calcium (Ca)-aluminum (Al), and the like.

The sealing portion 28 is provided to cover the plurality of organic EL elements (light-emitting elements) 30a in the organic EL display device 50a. In addition, the sealing portion 28 includes a first inorganic insulating film 25 provided to cover the second electrode 24, an organic film 26 provided on the first inorganic insulating film 25, and a second inorganic insulating film 27 provided to cover the organic film 26 as illustrated in FIG. 3 and functions to protect the organic EL layer 23 from moisture, oxygen, and the like.

The first inorganic insulating film 25 is a first sealing film provided on the plurality of organic EL elements 30a. Furthermore, the second inorganic insulating film 27 is a third sealing film provided above the organic film 26 serving as a second sealing film. In addition, the first inorganic insulating film 25 and the second inorganic insulating film 27 are formed of an inorganic material, for example, silicon oxide ($SiO_2$), aluminum oxide ($Al_2O_3$), a silicon nitride ($SiN_x$ (x is a positive number)) such as trisilicon tetranitride ($Si_3N_4$), silicon carbonitride (SiCN), or the like.

The organic film 26 is a second sealing film provided above the first sealing film. In addition, the organic film 26 is formed of a photosensitive organic material that can be coated in an ink-jet method, for example, an acrylic resin, a polyurea resin, a parylene resin, a polyimide resin, a polyamide resin, or the like. Furthermore, a film thickness of the organic film 26 is configured to be greater than a film thickness of the first inorganic insulating film 25 and a film thickness of the second inorganic insulating film 27 as illustrated in FIG. 3. To be specific, the first inorganic insulating film 25 and the second inorganic insulating film 27 are each formed with a film thickness of 1 μm, for example. Meanwhile, the organic film 26 is formed with a film thickness of 10 μm, for example.

In addition, the organic EL display device 50a includes a frame-shaped first bank 45 surrounding the display region D and a frame-shaped second bank 46 surrounding the first bank 45 in the frame region F as illustrated in FIG. 1, and the first bank 45 and the second bank 46 regulate spreading of the photosensitive organic material coated using the ink-jet method or the like.

The first bank 45 is formed of the same material in the same layer as the flattening film 19, for example. In addition, the first bank 45 is configured to overlap an edge 26e of the organic film 26 as illustrated in FIG. 6. In addition, the second electrode 24 is provided between the first bank 45 and the display region D to cover the display region D in a plan view as illustrated by the two-dot chain line in FIG. 1.

In addition, the second bank 46 includes, for example, a lower layer bank 46a formed of the same material in the same layer as the flattening film 19 and an upper layer bank 46b formed of the same material in the same layer as the edge cover 22 (FIG. 3) and is layered in the lower layer bank 46a as illustrated in FIG. 6. In addition, the first inorganic film 25, a light-transmissive conductive film 70, which will be described below, and the second inorganic insulating film 27 are provided to cover the second bank 46 in a plan view and to have each of edges in a frame shape sequentially positioned outside the second bank 46 as illustrated in FIG. 1.

In other words, in the organic EL display device 50a of the present embodiment, an edge 25e of the first inorganic insulating film 25 and an edge 27e of the second inorganic insulating film 27 are positioned outside the edge 26e of the organic film 26 in the frame region F (FIG. 1) as illustrated in FIG. 6. Furthermore, because the edge 27e of the second inorganic insulating film 27 is positioned outward of the edge 25e of the first inorganic insulating film 25 as illustrated in FIG. 6, the second inorganic insulating film 27 that is the outermost layer in the sealing portion 28 (FIG. 3) covers the plurality of organic EL elements 30a, and the sealing performance for each organic EL element 30a can be reliably improved.

Further, in the organic EL display device 50a of the present embodiment, the light-transmissive conductive film 70 described above is provided between two sealing films out of the first inorganic insulating film 25, the organic film 26, and the second inorganic insulating film 27. This light-transmissive conductive film 70 is electrically connected to the second electrode 24, as will be described in detail below. In addition, in the light-transmissive conductive film 70, an edge 70e of the light-transmissive conductive film 70 is configured to be positioned outward of the first bank 45 and the second bank 46 in a plan view as illustrated by the dot-dash line in FIG. 1.

In addition, the light-transmissive conductive film 70 may be formed of, for example, a metal compound film of indium tin oxide (ITO) or indium zinc oxide (IZO), or a highly flexible graphene film or metal nanowire film (e.g., a film containing silver nanowires or copper nanowires), or a metal nanoparticle film (e.g., a film containing silver nanowires or copper nanowires). In addition, a film thickness of the light-transmissive conductive film 70 is 100 nm, for example.

In addition, the light-transmissive conductive film 70 of the present embodiment includes a first conductive portion 70a provided between the first inorganic insulating film 25 and the organic film 26 inward of the edge 26e of the organic film 26, a second conductive portion 70b formed continuously with the first conductive portion 70a and provided between the first inorganic insulating film 25 and the second inorganic insulating film 27 outward of the edge 26e of the organic film 26, and a third conductive portion 70c formed continuously with the second conductive portion 70b and covered by the second inorganic insulating film 27 outward of the edge 25e of the first inorganic insulating film 25 as illustrated in FIG. 6.

In other words, the first conductive portion 70a is provided on the first inorganic insulating film 25 up to the edge 26e of the organic film 26 to cover the display region D. The second conductive portion 70b is provided on the first inorganic insulating film 25 between the edge 26e of the organic film 26 and the edge 25e of the first inorganic insulating film 25. The third conductive portion 70c is provided in contact with an electrode conduction portion A1 and the second interlayer insulating film 17 while being covered by the second inorganic insulating film 27 between the edge 25e of the first inorganic insulating film 25 and the edge 27e of the second inorganic insulating film 27. Note that, although an example in which the electrode conduction portion A1 is formed further outward from the display region D than a wiring line conduction portion S1 is illustrated in FIG. 6, in a case in which the electrode conduction portion A1 is formed inward of the wiring line conduction portion S1 (e.g., the electrode conduction portion A1 is formed up to an upper layer of the lower layer bank 46a of the second bank 46), the third conductive portion 70c is provided in contact with the wiring line conduction portion S1 and the second interlayer insulating film 17 while being covered by the second inorganic film 27 between the edge 25e of the first inorganic insulating film 25 and an edge 70eg (FIG. 1) of the light-transmissive conductive film 70.

The electrode conduction portion A1 is formed of the same material in the same layer as the first electrode 21. In addition, the electrode conduction portion A1 is in contact with the second electrode 24 at a trench T formed from a slit provided in the flattening film 19 as illustrated in FIG. 6. As a result, the third conductive portion 70c is in contact with the electrode conduction portion A1 or the wiring line conduction portion S1 and thus is electrically connected to the second electrode 24. As described above, the light-transmissive conductive film 70 is electrically connected to the second electrode 24 via the electrode conduction portion A1 and the wiring line conduction portion S1.

Furthermore, the electrode conduction portion A1 is in contact with the wiring line conduction portion S1 formed of the same material in the same layer as the wiring line layer of the TFT layer 20a (FIG. 3), for example, the source line Sa, in the frame region F (see FIG. 6). To be specific, the contact region between the electrode conduction portion A1 and the wiring line conduction portion S1 is provided to correspond to the portion obtained by excluding the central portion of one side facing the terminal portion E of the four sides of the display region D from the portion in which the flattening film 19 is opened and the wiring line conduction portion S1 is exposed (the portion indicated by the right-upward hatched portion and the cross-hatched portion in FIG. 1). This corresponds to an opening portion of the flattening film 19 formed between the flattening film 19 and the second bank 46 to surround the display region D, or an opening portion of the flattening film 19 outward of the second bank from the display region D.

Furthermore, the wiring line conduction portion S1 is formed in a region indicated by the right-upward hatched portion and the cross hatched portion in FIG. 1, for example, and is electrically connected to the low power supply voltage source described above via a lead wiring line, which is not illustrated, and the terminal portion E, and the low power supply voltage source and the second electrode 24 are conductive with each other. In the portion indicated by the cross hatched portion, both the wiring line conduction portion S1 and the electrode conduction portion A1 may be formed as described above as illustrated in FIG. 6, or either the wiring line conduction portion S1 or the electrode conduction portion A1 may be formed. At least the third conductive portion 70c is in contact with and is electrically connected to the wiring line conduction portion S1 or the electrode conduction portion A1 and may be conductive with the second electrode 24.

Note that, as illustrated by the right-downward hatched portion in FIG. 1, a high power supply voltage main line portion (high power supply voltage electrode portion) H1 is formed as a lower layer of the first bank 45 and the second bank 46 at a center portion on one side facing the terminal portion E, for example, using the same material in the same layer as the source line Sa. The plurality of power source lines Sb (FIG. 2) diverge from the high power supply voltage main line portion H1 and extend to the display region D. Furthermore, the high power supply voltage main line portion H1 is electrically connected to the high power supply voltage source described above via the lead wiring line, which is not illustrated, and the terminal portion E.

The organic EL display device 50a described above is configured such that, in each subpixel P, a gate signal is input to the first thin film transistor 9a via the gate line 12 to thereby turn on the first thin film transistor 9a, a predetermined voltage corresponding to a source signal is written in the gate electrode 12b of the second thin film transistor 9b and the capacitor 9c via the source line Sa, a current from the power source line Sb specified based on a gate voltage of the second thin film transistor 9b is supplied to the organic EL layer 23, and thereby the light-emitting layer 3 of the organic EL layer 23 emits light to display an image.

In addition, in the organic EL display device 50a, because a gate voltage of the second thin film transistor 9b is held by the capacitor 9c even when the first thin film transistor 9a is turned off, the light-emitting layer 3 keeps emitting light until a gate signal of the next frame is input.

In the organic EL display device 50a of the present embodiment configured as described above, the light-transmissive conductive film 70 is electrically connected to the second electrode 24. Thus, in the organic EL display device 50a of the present embodiment, it is possible to easily reduce the resistance of the second electrode 24 and greatly suppress the occurrence of variations in the resistance. As a result, in the present embodiment, the high-performance organic EL display device 50a with a curbed reduction in brightness of the display region D can be easily configured.

In addition, in the organic EL display device 50a according to the present embodiment, the light-transmissive conductive film 70 includes the first conductive portion 70a provided between the first inorganic insulating film 25 and the organic film 26, the second conductive portion 70b provided between the first inorganic insulating film 25 and the second inorganic insulating film 27, and the third conductive portion 70c covered by the second inorganic insulating film 27. As a result, in the organic EL display device 50a of the present embodiment, the sealing performance for the organic EL element 30a can be improved, and the life of the organic EL element 30a can be easily extended.

First Modified Example of First Embodiment

Figure 7:
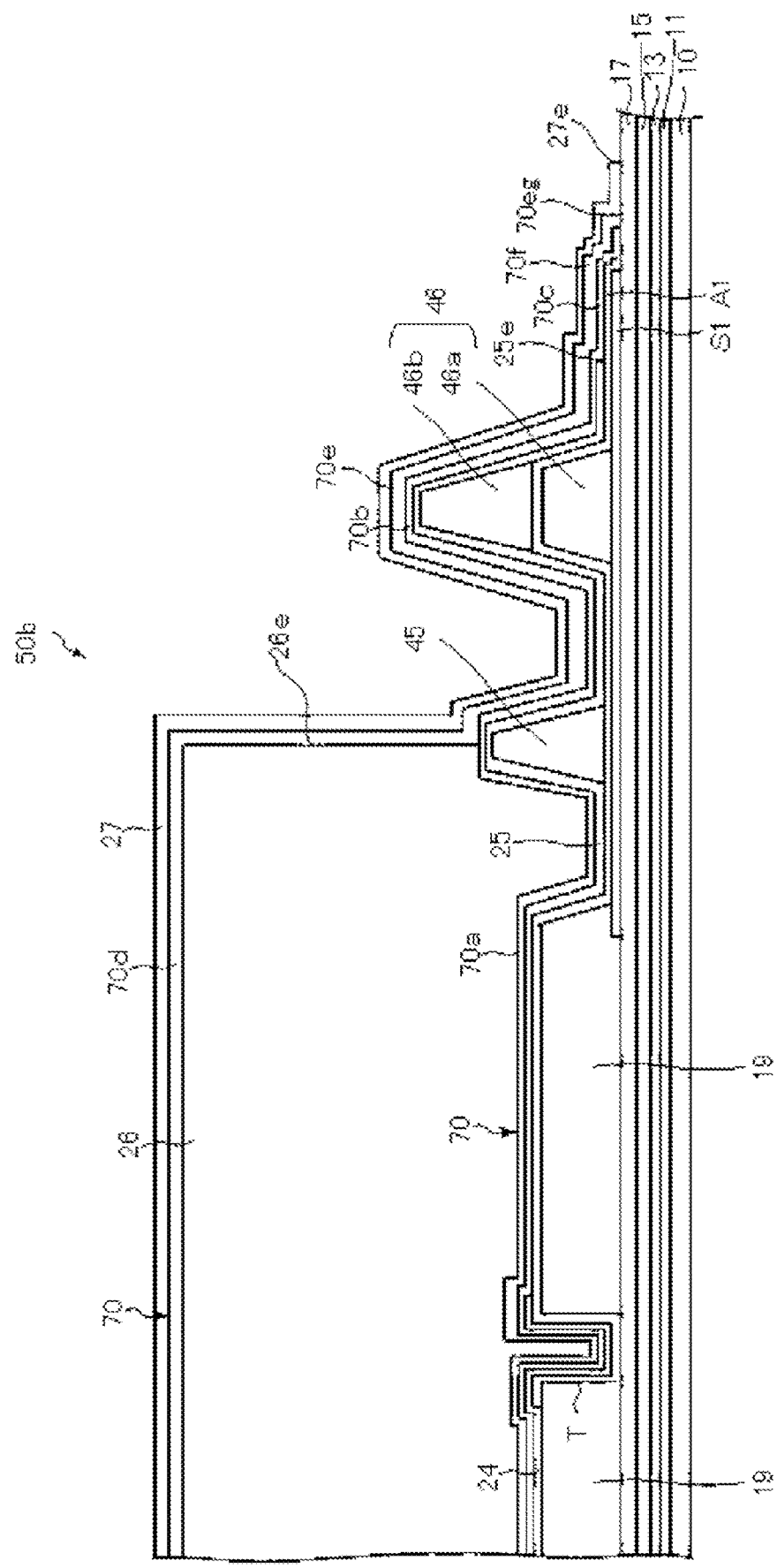
FIG. 7 is a cross-sectional view illustrating a configuration of main parts of a first modification example of the organic EL display device according to the first embodiment, which corresponds to a cross-sectional view along the line VI-VI of FIG. 1.

FIG. 7 is a cross-sectional view illustrating a configuration of main parts of a first modification example of the organic EL display device according to the first embodiment, which corresponds to a cross-sectional view along the line VI-VI of FIG. 1.

In FIG. 7, the present embodiment differs from the first embodiment in that a light-transmissive conductive film 70 (a fourth conductive portion 70d, a fifth conductive portion 70e, and a sixth conductive portion 70f) formed as an upper layer of the organic film 26 is provided in addition to the light-transmissive conductive film 70 (the first conductive portion 70a, the second conductive portion 70b, and the third conductive portion 70c) formed as a lower layer of the organic film 26. Note that elements common to those the first embodiment are denoted by the same reference signs, and overlapping description thereof will be omitted.

In an organic EL display device 50b of the present embodiment, the light-transmissive conductive film 70 as an upper layer includes the fourth conductive portion 70d provided between the organic film 26 and the second inorganic insulating film 27 inward of the edge 26e of the organic film 26, the fifth conductive portion 70e that is formed continuously with the fourth conductive portion 70d and provided between the second conductive portion 70b and the second inorganic insulating film 27 outward of the edge 26e of the organic film 26, and the sixth conductive portion 70f that is formed continuously with the fifth conductive portion 70e and covered by the second inorganic insulating film 27 outward of the edge 25e of the first inorganic insulating film 25 as illustrated in FIG. 7.

To be specific, the fourth conductive portion 70d is provided on the organic film 26 up to the edge 26e of the organic film 26 to cover the display region D, similarly to the first conductive portion 70a. The fifth conductive portion 70e is provided in contact with the second conductive portion 70b between the edge 26e of the organic film 26 and the edge 25e of the first inorganic insulating film 25. The sixth conductive portion 70f is provided in contact with the third conductive portion 70c and the second interlayer insulating film 17 while being covered by the second inorganic insulating film 27 between the edge 25e of the first inorganic insulating film 25 and the edge 27e of the second inorganic insulating film 27.

Also, the light-transmissive conductive film 70 as an upper layer is electrically connected to the second electrode 24 via the wiring line conduction portion S1 and the electrode conduction portion A1 as illustrated in FIG. 7, similarly to the light-transmissive conductive film 70 as a lower layer of the first embodiment. Note that the sixth conductive portion 70f may not be provided in a portion of the fifth conductive portion 70e if it comes in contact with the second conductive portion 70b and is electrically connected to the light-transmissive conductive film 70 as a lower layer.

With the above configuration, the present embodiment can achieve actions and effects similar to those of the first embodiment. Further, because the light-transmissive conductive film 70 (the fourth conductive portion 70d, the fifth conductive portion 70e, and the sixth conductive portion 70f) as an upper layer are further provided in the present embodiment, the resistance of the second electrode 24 can be more easily lowered, and variations in the resistance can be further reduced compared to the first embodiment. Therefore, in the organic EL display device 50b of the present embodiment, a reduction in brightness of the display region D can be further curbed.

Further, in the organic EL display device 50b of the present embodiment, because the fourth conductive portion 70d, the fifth conductive portion 70e, and the sixth conductive portion 70f each provided between two sealing films of the first inorganic insulating film 25, the organic film 26, and the second inorganic insulating film 27 are included, in addition to the configuration of the first embodiment described above, the sealing performance for the organic EL element 30a can be improved and the life of the organic EL element 30a can be more easily extended compared to that of the first embodiment.

Second Modification Example of First Embodiment

Figure 8:
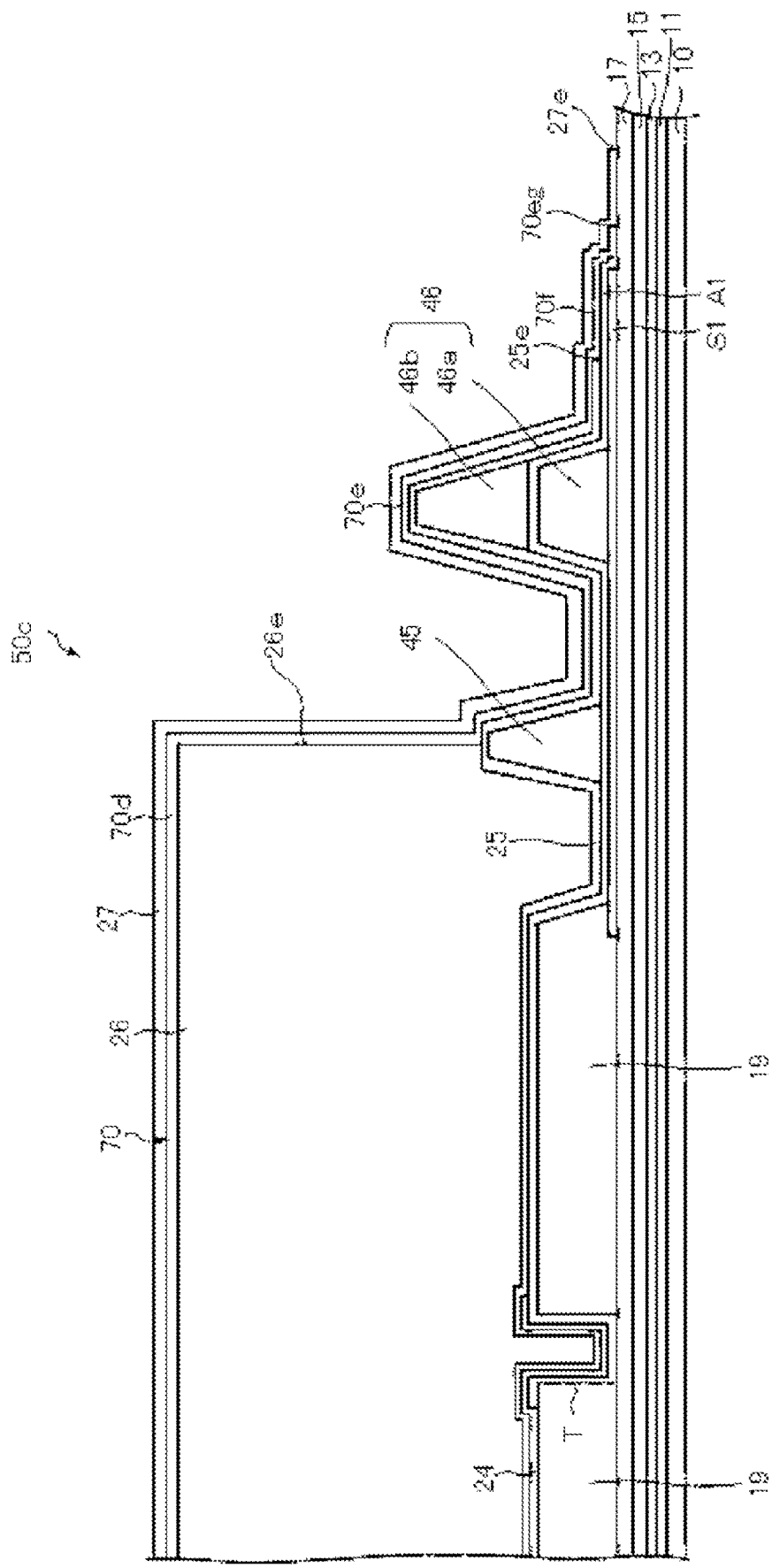
FIG. 8 is a cross-sectional view illustrating a configuration of main parts of a second modification example of the organic EL display device according to the first embodiment, which corresponds to a cross-sectional view along the line VI-VI of FIG. 1.

FIG. 8 is a cross-sectional view illustrating a configuration of main parts of a second modification example of the organic EL display device according to the first embodiment, which corresponds to a cross-sectional view along the line VI-VI of FIG. 1.

In FIG. 8, the present embodiment differs from the first embodiment in that a light-transmissive conductive film 70 (the fourth conductive portion 70d, the fifth conductive portion 70e, and the sixth conductive portion 70f) as an upper layer is provided instead of the light-transmissive conductive film 70 (the first conductive portion 70a, the second conductive portion 70b, and the third conductive portion 70c) as a lower layer. Note that elements common in the first embodiment are denoted by the same reference signs, and overlapping description thereof will be omitted.

In an organic EL display device 50c of the present embodiment, a light-transmissive conductive film 70 includes a fourth conductive portion 70d provided between the organic film 26 and the second inorganic insulating film 27 inward of the edge 26e of the organic film 26, a fifth conductive portion 70e that is formed continuously with the fourth conductive portion 70d and provided between the first inorganic insulating film 25 and the second inorganic insulating film 27 outward of the edge 26e of the organic film 26, and a sixth conductive portion 70f that is formed continuously with the fifth conductive portion 70e and is covered by the second inorganic insulating film 27 outward of the edge 25e of the first inorganic insulating film 25 as illustrated in FIG. 8.

To be specific, the fourth conductive portion 70d is provided on the organic film 26 up to the edge 26e of the organic film 26 to cover the display region D, similarly to the first conductive portion 70a. The fifth conductive portion 70e is provided in contact with the first inorganic insulating film 25 between the edge 26e of the organic film 26 and the edge 25e of the first inorganic insulating film 25. The sixth conductive portion 70f is provided in contact with the electrode conduction portion A1 (or wiring line conduction portion S1) and the second interlayer insulating film 17 while being covered by the second inorganic insulating film 27 between the edge 25e of the first inorganic insulating film 25 and the edge 27e of the second inorganic insulating film 27.

In addition, in the light-transmissive conductive film 70, the sixth conductive portion 70f is in contact with the electrode conduction portion A1 (or the wiring line conduction portion S1), and the light-transmissive conductive film 70 is electrically connected to the second electrode 24 via the electrode conduction portion A1 and the wiring line conduction portion S1, similarly to that of the first embodiment.

With the above configuration, the present embodiment can achieve actions and effects similar to those of the first embodiment.

Third Modification Example of First Embodiment

Figure 9:
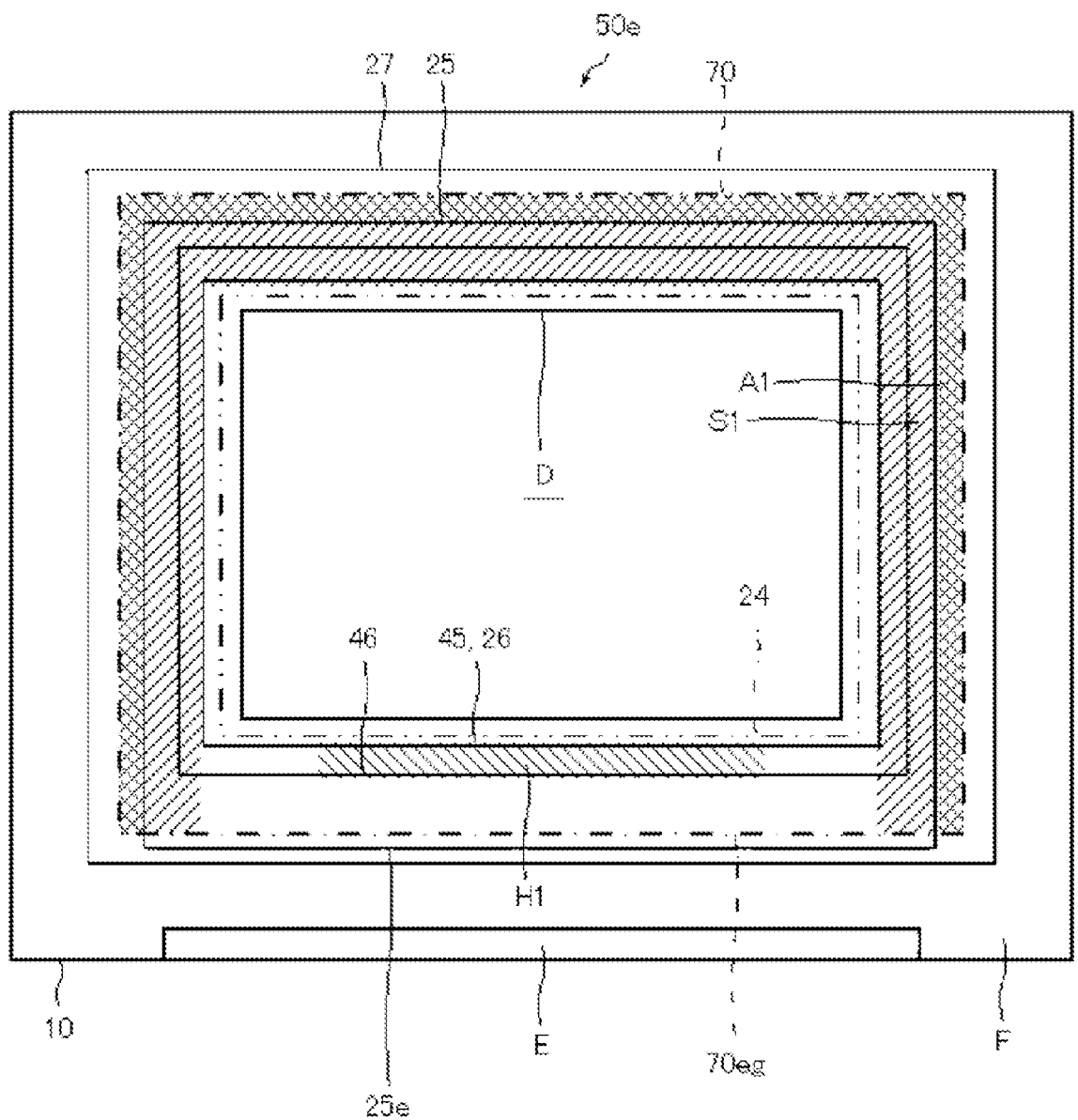
FIG. 9 is a plan view illustrating a configuration of main parts of a third modification example of the organic EL display device according to the first embodiment.

FIG. 9 is a plan view illustrating a configuration of main parts of a third modification example of the organic EL display device according to the first embodiment.

In FIG. 9, the present embodiment differs from the first embodiment in that the edge 25e of the first inorganic insulating film 25 is outward of the edge 70eg of the light-transmissive conductive film 70. Note that elements common in the first embodiment are denoted by the same reference signs, and overlapping description thereof will be omitted.

In an organic EL display device 50e of the present embodiment, in a portion of the frame region F on the display region D side facing the terminal portion E, the edge 25e (FIG. 6) of the first inorganic insulating film 25 is positioned at the outer side of the edge 70eg of the light-transmissive conductive film 70 as illustrated in FIG. 9. For this reason, the first inorganic insulating film 25 is installed between the light-transmissive conductive film 70 and a wiring line, which is not illustrated, of the light-transmissive conductive film 70 provided on a base substrate 10 side, and thus wiring lines can also be formed in this region. To be specific, a plurality of lead wiring lines (not illustrated) formed of the same material in the same layer as the source line Sa are provided between the terminal portion E and the high power supply voltage main line portion H1 as the above-described wiring lines and these lead wiring lines are formed of a material having a lower resistivity than the gate line 12 (e.g., aluminum or copper). In the present embodiment, in addition to the effects of the first embodiment, by forming the edge 25e of the first inorganic insulating film 25 at the outer side of the edge 70eg of the light-transmissive conductive film 70 on the side of the terminal portion E side, the lead wiring lines can be provided in the region, and wiring line resistance can be reduced compared to a case in which wiring lines of the region are set to lead wiring lines formed of the same material in the same layer as the gate line 12. This configuration can be applied to each of the above-described embodiments in which the light-transmissive conductive film 70 is formed as any of a lower layer or an upper layer of the organic film 26.

Second Embodiment

Figure 10:
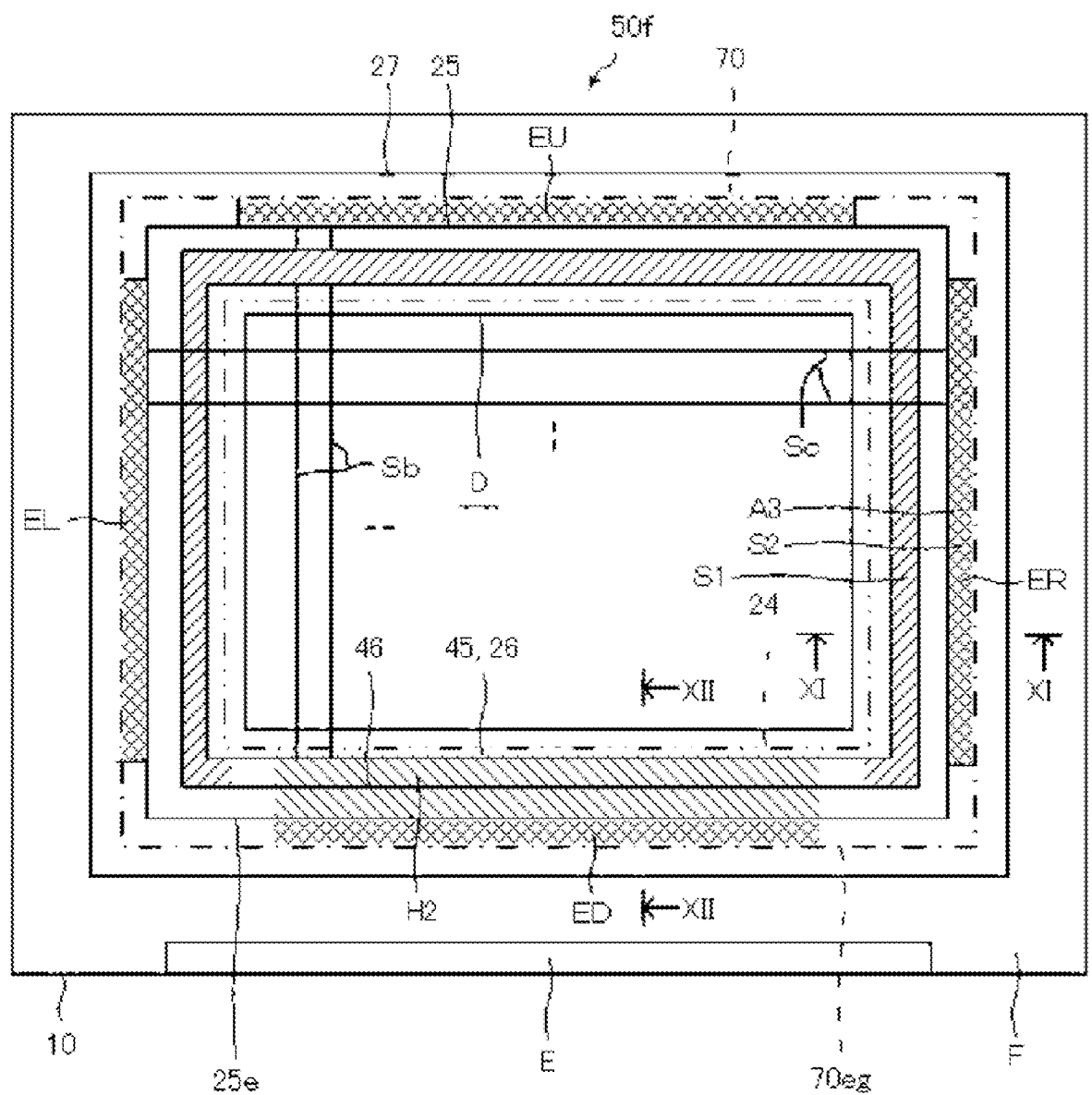
FIG. 10 is a plan view illustrating a configuration of main parts of an organic EL display device according to a second embodiment of the disclosure.
Figure 11:
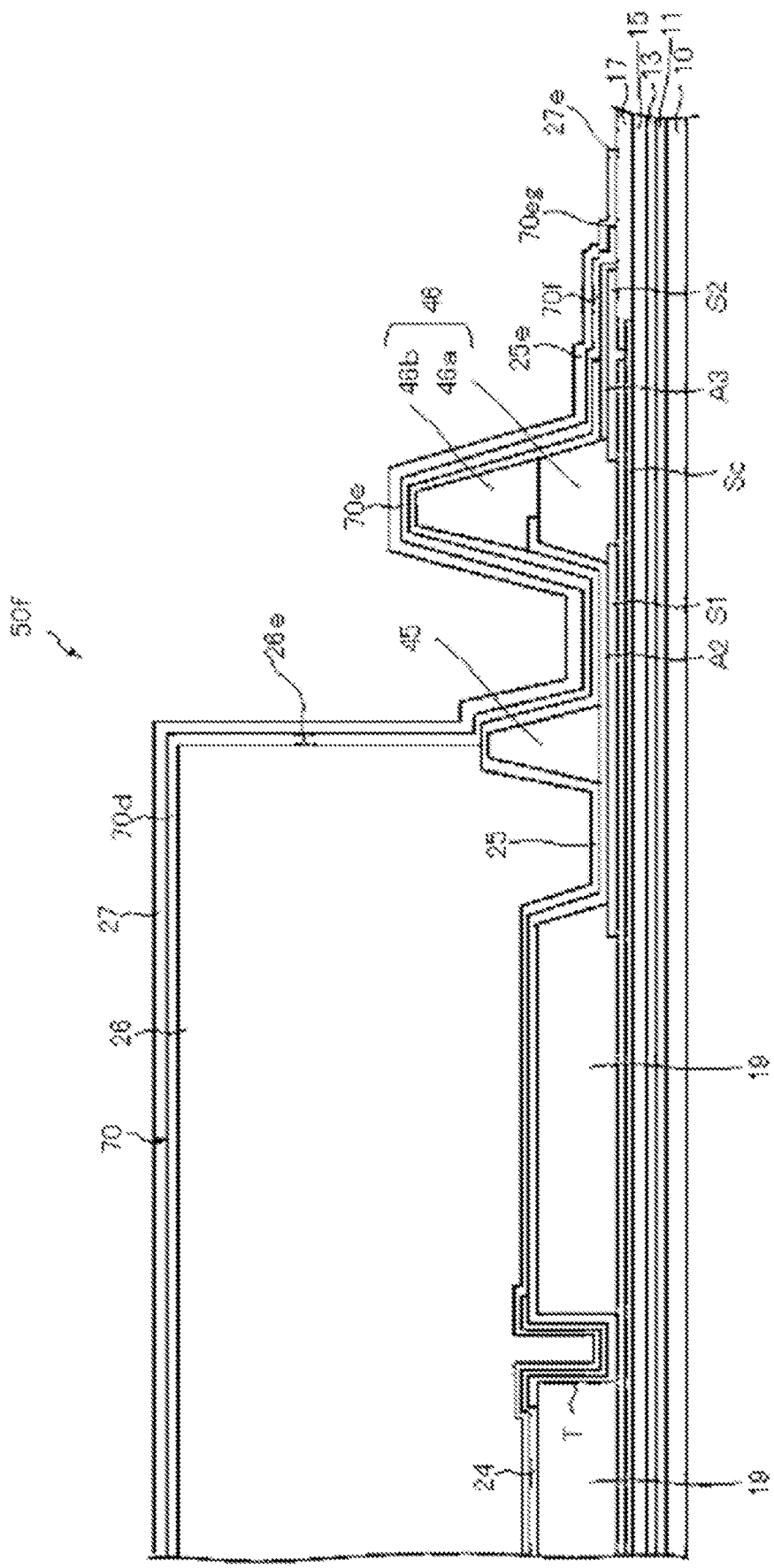
FIG. 11 is a cross-sectional view illustrating a configuration of main parts of a display region of the organic EL display device illustrated in FIG. 10 and a cross-sectional view along the line XI-XI of FIG. 10.
Figure 12:
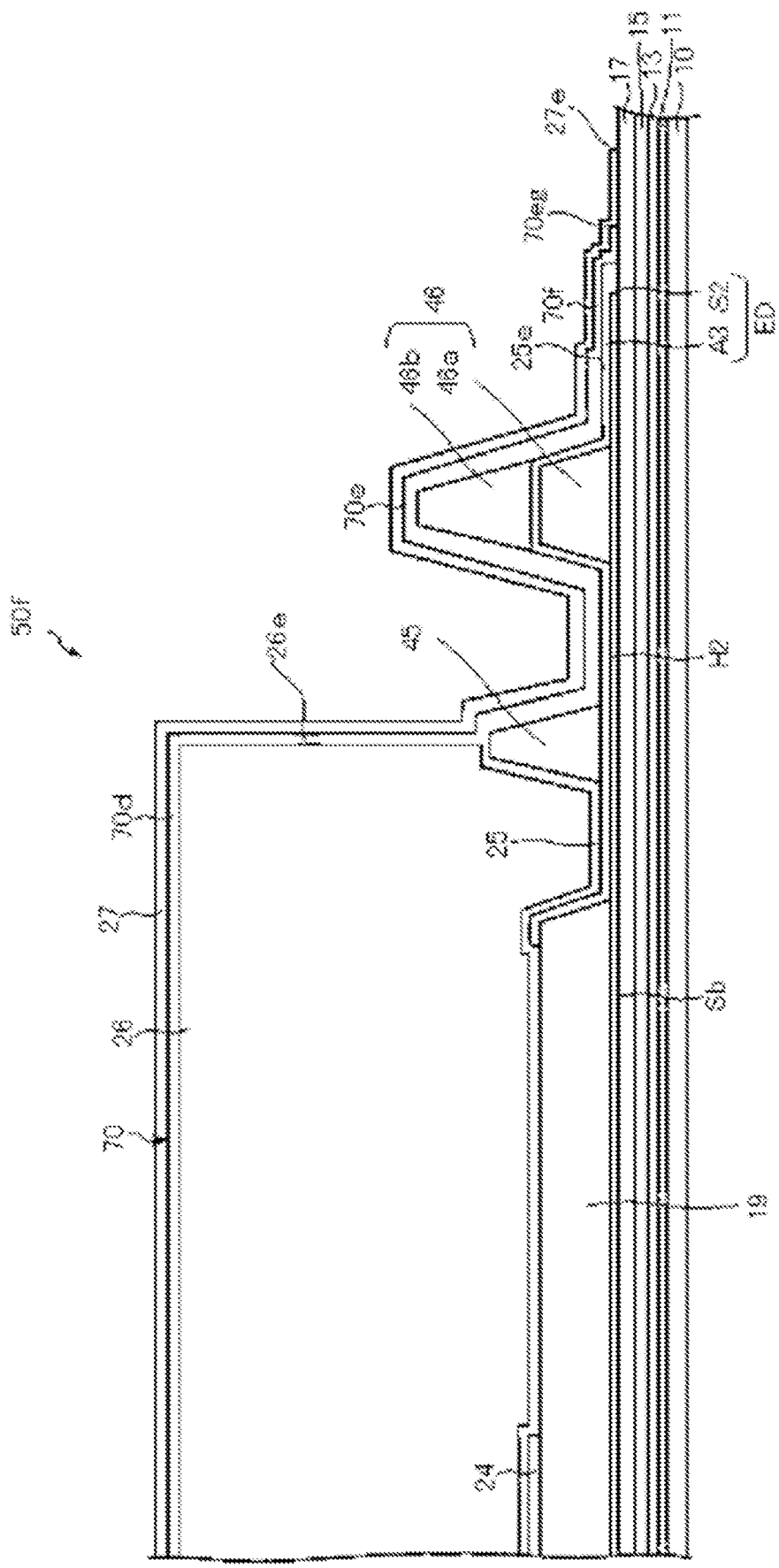
FIG. 12 is a cross-sectional view illustrating a configuration of the main parts of the display region of the organic EL display device illustrated in FIG. 10 and a cross-sectional view along the line XII-XII of FIG. 10.

FIG. 10 is a plan view illustrating a configuration of main parts of an organic EL display device according to a second embodiment of the disclosure. FIG. 11 is a cross-sectional view illustrating a configuration of main parts of a display region of the organic EL display device illustrated in FIG. 10 and a cross-sectional view along the line XI-XI of FIG. 10. FIG. 12 is a cross-sectional view illustrating a configuration of the main parts of the display region of the organic EL display device illustrated in FIG. 10 and a cross-sectional view along the line XII-XII of FIG. 10.

In the drawings, the main difference between the present embodiment and the first embodiment is that the light-transmissive conductive film 70 is electrically connected to the first electrode 21. Note that elements common to those the first embodiment are denoted by the same reference signs, and overlapping description thereof will be omitted.

In an organic EL display device 50f of the present embodiment, a light-transmissive conductive film 70 includes a fourth conductive portion 70d provided between the organic film 26 and the second inorganic insulating film 27 inward of the edge 26e of the organic film 26, a fifth conductive portion 70e that is formed continuously with the fourth conductive portion 70d and provided between the first inorganic insulating film 25 and the second inorganic insulating film 27 outward of the edge 26e of the organic film 26, and a sixth conductive portion 70f that is formed continuously with the fifth conductive portion 70e and is covered by the second inorganic insulating film 27 outward of the edge 25e of the first inorganic insulating film 25 as illustrated in FIG. 12.

To be specific, the fourth conductive portion 70d is provided on the organic film 26 up to the edge 26e of the organic film 26 to cover the display region D, similarly to the first conductive portion 70a. The fifth conductive portion 70e is provided in contact with the first inorganic insulating film 25 between the edge 26e of the organic film 26 and the edge 25e of the first inorganic insulating film 25. The sixth conductive portion 70f is provided in contact with an electrode conduction portion A3 (or a wiring line conduction portion S2) and the second interlayer insulating film 17 while being covered by the second inorganic insulating film 27 between the edge 25e of the first inorganic insulating film 25 and the edge 27e of the second inorganic insulating film 27.

In addition, in the organic EL display device 50f of the present embodiment, a plurality of, for example, four high power supply voltage electrode portions EU, ED, EL, and ER are provided as indicated by the cross hatched portion in FIG. 10. However, as in the first embodiment, high power supply voltage electrode portions may be continuously provided. Each of these high power supply voltage electrode portions EU, ED, EL, and ER are contact regions of the electrode conduction portion A3 formed of the same material in the same layer as the first electrode 21 and the wiring line conduction portion S2 formed of the same material in the same layer as the source line Sa, and are electrically connected to the high power supply voltage source described above via the lead wiring lines, which are not illustrated, and the terminal portion E.

In addition, the high power supply voltage electrode portion ED has a high power supply voltage main line portion H2 formed of the same material in the same layer as the source line Sa, continuous with the contact region with the electrode conduction portion A3, and is electrically connected to one ends of power source lines Sb as indicated by the right-downward hatched portion in FIG. 10. In addition, the other ends of the power source lines Sb are electrically connected to the high power supply voltage electrode portion EU. In addition, conduction of the power source lines Sb with the wiring line conduction portion S1 is prevented by being reconnected to a wiring line portion formed of the same material in the same layer as the gate line 12 (or the capacitance wiring line 16) at the intersection with the wiring line conduction portion S1 (electrically conductive with the second electrode 24) as indicated by the right-upward hatched portion in FIG. 10. As a result, the light-transmissive conductive film 70 is electrically connected to the first electrode 21 via the power source lines Sb included in the high power supply voltage line.

In addition, in the organic EL display device 50f of the present embodiment, the wiring line conduction portion S1 is in contact with the electrode conduction portion A2 formed of the same material in the same layer as the first electrode 21 as illustrated in FIG. 11. The electrode conduction portion A2 is electrically connected to the second electrode 24 at the trench T. Thus, in the organic EL display device 50f of the present embodiment, the second electrode 24 and the low power supply voltage source are electrically connected to each other.

In addition, in the organic EL display device 50f of the present embodiment, the wiring line conduction portion S2 is electrically connected to a high power supply voltage branch line Sc formed of the same material in the same layer as the upper conductive layer (capacitance wiring line) 16 via a contact hole formed in the second interlayer insulating film 17 as illustrated in FIG. 11. The high power supply voltage branch line Sc is included in the high power supply voltage line described above, and as illustrated in FIG. 11, a plurality of the high power supply voltage branch lines Sc are arranged in the horizontal direction of the drawing, and are disposed on the display region D in a matrix shape with a plurality of power source lines Sb. At a position at which a power source line Sb and the high power supply voltage branch line Sc intersect, the power source line Sb and the high power supply voltage branch line Sc are electrically connected via a contact hole formed in the second interlayer insulating film 17. Further, one ends and the other ends of the plurality of high power supply voltage branch lines Sc are electrically connected to the high power supply voltage electrode portions EL and ER, respectively. In addition, each of the high power supply voltage branch lines Sc is electrically connected to the light-transmissive conductive film 70 via the electrode conduction portion A3 in each of the high power supply voltage electrode portions EL and ER.

Note that, in addition to the above description, a configuration in which the high power supply voltage branch lines Sc formed of the same material in the same layer as the gate line 12 are used may be adopted.

In the organic EL display device 50f of the present embodiment configured as described above, the light-transmissive conductive film 70 is electrically connected to the first electrode 21. As a result, in the organic EL display device 50f of the present embodiment, it is possible to easily reduce the resistance of the first electrode 21 and greatly suppress the occurrence of variations in the resistance. As a result, in the present embodiment, the high-performance organic EL display device 50f with a curbed reduction in brightness of the display region D can be easily configured.

In addition, in the organic EL display device 50f of the present embodiment, because the light-transmissive conductive film 70 is connected to the power source lines Sb and the high power supply voltage branch lines Sc included in the high power supply voltage line, it is possible to easily reduce the resistance of the high power supply voltage line and greatly suppress the occurrence of variations in the resistance. As a result, in the present embodiment, the high-performance organic EL display device 50f with a curbed reduction in brightness of the display region D can be easily configured.

Modification Example of Second Embodiment

Figure 13:
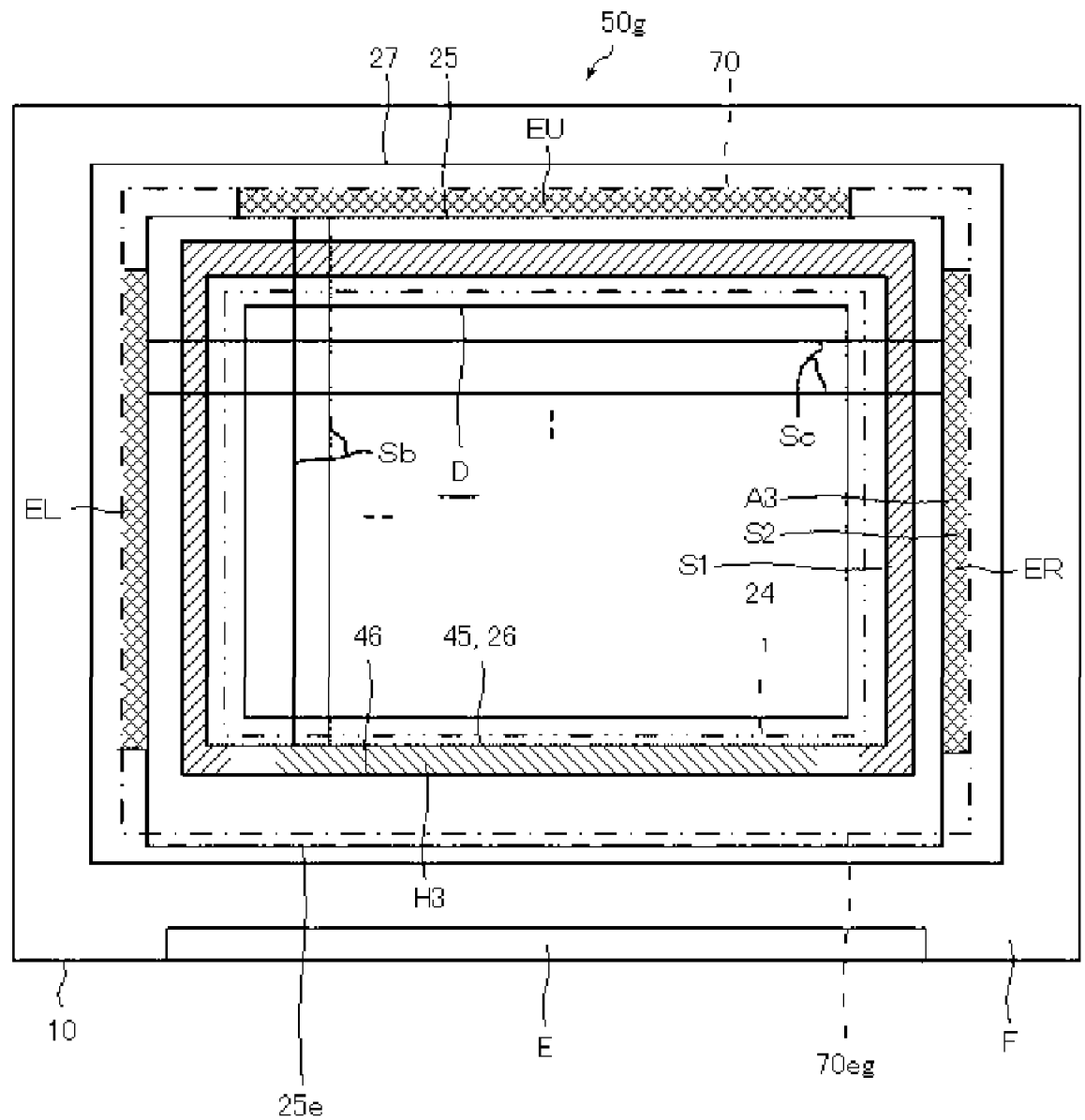
FIG. 13 is a plan view illustrating a configuration of main parts of a modification example of the organic EL display device according to the second embodiment.

FIG. 13 is a plan view illustrating a configuration of main parts of a modification example of the organic EL display device according to the second embodiment.

In FIG. 13, the present embodiment differs from the second embodiment in that the edge of the first inorganic insulating film 25 is located outward of the edge 70eg of the light-transmissive conductive film 70 and no high power supply voltage electrode portion ED is formed. Note that elements common in the first embodiment are denoted by the same reference signs, and overlapping description thereof will be omitted.

In an organic EL display device 50g of the present embodiment, in a portion of the frame region F on the display region D side facing the terminal portion E, the edge 25e of the first inorganic insulating film 25 is positioned outward of the edge 70eg of the light-transmissive conductive film 70 as illustrated in FIG. 13. For this reason, the first inorganic insulating film 25 is installed between the light-transmissive conductive film 70 and a wiring line, which is not illustrated, of the light-transmissive conductive film 70 provided on a base substrate 10 side, and thus wiring lines can also be formed in this region.

To be specific, in the present embodiment, a high power supply voltage main line portion H3 formed of the same material in the same layer as the source line Sa is provided instead of the high power supply voltage electrode portion ED as illustrated by the right-downward hatched portion in FIG. 13. Furthermore, in the present embodiment, a lead wiring line (not illustrated) formed of the same material in the same layer as the source line Sa is provided as a wiring line between the terminal portion E and the high power supply voltage main line portion H3, and in the present embodiment, in addition to the effects of the second embodiment, by forming the edge 25e of the first inorganic insulating film 25 at the outer side of the edge 70eg of the light-transmissive conductive film 70 on the side of the terminal portion E side, the lead wiring line can be provided in the region, and thus the wiring line resistance can be further reduced than when the wiring line in the region is set to a lead wiring line formed of the same material in the same layer as the gate line 12.

Note that, also in the first embodiment, a plurality of, for example, four high power supply voltage electrode portions EU, ED, EL, and ER may be provided as illustrated in the second embodiment.

In addition, although the organic EL display device including the first electrode as an anode electrode and the second electrode as a cathode electrode is exemplified in each of the embodiments described above, the disclosure is also applicable to an organic EL display device with the inverted layered structure of organic EL layers including a first electrode as a cathode electrode and a second electrode as an anode electrode.

In addition, although the organic EL display device including an element substrate, in which the electrode of the TFT connected to the first electrode serves as a drain electrode, is exemplified in each of the embodiments described above, the disclosure is also applicable to an organic EL display device including an element substrate, in which the electrode of the TFT connected to the first electrode is referred to as a source electrode.

In addition, although the organic EL display devices are exemplified as a display device in each of the above-described embodiments, the disclosure is applicable to a display device including a plurality of light-emitting elements that are driven by a current. For example, the disclosure can be applied to display devices including quantum dot light-emitting diodes (QLEDs), which are light-emitting elements using a quantum dot-containing layer.

INDUSTRIAL APPLICABILITY

The disclosure is useful for an organic EL display device capable of curbing a reduction in luminance caused by resistance of internal wiring lines, electrodes, and the like.

REFERENCE SIGNS LIST

D Display region
F Frame region
E Terminal portion
10 Base substrate
20a TFT layer
21 First electrode (anode electrode)
23 Organic EL layer (function layer)
24 Second electrode (cathode electrode)
25 First inorganic insulating film (first sealing film)
25e Edge
26 Organic film (second sealing film)
26e Edge
27 Second inorganic insulating film (third sealing film)
27e Edge
28 Sealing portion
30a Organic EL element (light-emitting element)
70 Light-transmissive conductive film
70eg Edge
70a First conductive portion
70b Second conductive portion
70c Third conductive portion
70d Fourth conductive portion
70e Fifth conductive portion
70f Sixth conductive portion
50a to 50g Organic EL display device

The invention claimed is:

1. A display device comprising:
a base substrate;
a TFT layer provided on the base substrate;
a plurality of light-emitting elements provided on the TFT layer;
a sealing portion provided covering the plurality of light-emitting elements;
a display region defined by the plurality of light-emitting elements; and
a frame region surrounding the display region,
wherein the plurality of light-emitting elements include a plurality of first electrodes, a second electrode shared by the plurality of light-emitting elements, and a function layer interposed between the plurality of first electrodes and the second electrode,
the sealing portion includes a first sealing film provided on the plurality of light-emitting elements, a second sealing film provided above the first sealing film, a third sealing film provided above the second sealing film, and a light-transmissive conductive film provided between two sealing films of the first sealing film, the second sealing film, and the third sealing film,
an edge of the first sealing film and an edge of the third sealing film are positioned outward of an edge of the second sealing film in the frame region, and
the light-transmissive conductive film is electrically connected to the plurality of first electrodes or the second electrode.

2. The display device according to claim 1,
wherein the first sealing film and the third sealing film are inorganic insulating films,
the second sealing film is an organic film, and
a film thickness of the second sealing film is greater than a film thickness of the first sealing film and a film thickness of the third sealing film.

3. The display device according to claim 1,
wherein each of the plurality of first electrode are an anode electrode, and
the second electrode is a cathode electrode.

4. The display device according to claim 1, further comprising:
a bank overlapping the edge of the second sealing film,
wherein, in a plan view, an edge of the light-transmissive conductive film is positioned outward of the bank.

5. The display device according to claim 1,
wherein the light-transmissive conductive film includes:
a first conductive portion provided between the first sealing film and the second sealing film inward of the edge of the second sealing film,
a second conductive portion formed continuously with the first conductive portion and provided between the first sealing film and the third sealing film outward of the edge of the second sealing film, and
a third conductive portion formed continuously with the second conductive portion and covered by the third sealing film outward of the edge of the first sealing film.

6. The display device according to claim 5, further comprising:
an electrode conduction portion formed of the same material and in the same layer as the plurality of first electrodes,
wherein the third conductive portion is in contact with the electrode conduction portion and is electrically connected to the second electrode.

7. The display device according to claim 6, further comprising:
a wiring line conduction portion formed of the same material and in the same layer as a wiring line layer of the TFT layer,
wherein the third conductive portion is in contact with the wiring line conduction portion and is electrically connected to the second electrode via the electrode conduction portion.

8. The display device according to claim 5, further comprising:
a terminal portion provided at an end portion of the frame region, wherein the edge of the first sealing film is outward of an edge of the light-transmissive conductive film in a portion of the frame region on the display region side facing the terminal portion.

9. The display device according to claim 1,
wherein the light-transmissive conductive film includes:
a fourth conductive portion provided between the second sealing film and the third sealing film inward of the edge of the second sealing film,
a fifth conductive portion formed continuously with the fourth conductive portion and provided between the first sealing film and the third sealing film outward of the edge of the second sealing film, and
a sixth conductive portion formed continuously with the fifth conductive portion and covered by the third sealing film outward of the edge of the first sealing film.

10. The display device according to claim 9, further comprising:
an electrode conduction portion formed of the same material and in the same layer as the plurality of first electrodes, wherein the sixth conductive portion is in contact with the electrode conduction portion and is electrically connected to the plurality of first electrodes or the second electrode.

11. The display device according to claim 10, wherein a plurality of the electrode conduction portions are provided.

12. The display device according to claim 9, further comprising:
a wiring line conduction portion formed of the same material and in the same layer as a wiring line layer of the TFT layer,
wherein the sixth conductive portion is in contact with the wiring line conduction portion and is electrically connected to the plurality of first electrodes or the second electrode.

13. The display device according to claim 12, wherein a plurality of the wiring line conduction portions are provided.

14. The display device according to claim 1,
wherein the light-transmissive conductive film includes:
a first conductive portion provided between the first sealing film and the second sealing film inward of the edge of the second sealing film,
a second conductive portion formed continuously with the first conductive portion and provided between the first sealing film and the third sealing film outward of the edge of the second sealing film,
a third conductive portion formed continuously with the second conductive portion and covered by the third sealing film outward of the edge of the first sealing film,
a fourth conductive portion provided between the second sealing film and the third sealing film inward of the edge of the second sealing film,
a fifth conductive portion formed continuously with the fourth conductive portion and provided between the second conductive portion and the third sealing film outward of the edge of the second sealing film, and
a sixth conductive portion formed continuously with the fifth conductive portion and provided between the third conductive portion and the third sealing film outward of the edge of the first sealing film.

15. The display device according to claim 14, further comprising:
an electrode conduction portion formed of the same material and in the same layer as the plurality of first electrodes,
wherein the third conductive portion is in contact with the electrode conduction portion and is electrically connected to the second electrode.

16. The display device according to claim 15, further comprising:
a wiring line conduction portion formed of the same material and in the same layer as a wiring line layer of the TFT layer,
wherein the third conductive portion is in contact with the wiring line conduction portion and is electrically connected to the second electrode via the electrode conduction portion.

17. The display device according to claim 14, further comprising:
a terminal portion provided at an end portion of the frame region,
wherein the edge of the first sealing film is outward of an edge of the light-transmissive conductive film in a portion of the frame region on the display region side facing the terminal portion.

18. The display device according to claim 1, wherein the second sealing film includes a photosensitive organic material capable of being coated by using an ink-jet method.

19. The display device according to claim 1, wherein the light-transmissive conductive film contains at least one of graphene, metal nanowires, and metal nanoparticles.

* * * * *